United States Patent
Zeng et al.

(10) Patent No.: US 10,084,333 B2
(45) Date of Patent: Sep. 25, 2018

(54) CHARGING METHOD, POWER ADAPTER, MOBILE TERMINAL, AND CHARGING SYSTEM

(71) Applicant: GUANGDONG OPPO MOBILE TELECOMMUNICATIONS CORP., LTD., Dongguan (CN)

(72) Inventors: Yuanqing Zeng, Dongguan (CN); Zhihua Hu, Dongguan (CN)

(73) Assignee: Guangdong Oppo Mobile Telecommunications Corp., Ltd., Dongguan, Guangdong (CN)

(*) Notice: Subject to any disclaimer, the term of this patent is extended or adjusted under 35 U.S.C. 154(b) by 100 days.

(21) Appl. No.: 15/427,716

(22) Filed: Feb. 8, 2017

(65) Prior Publication Data
US 2017/0256961 A1    Sep. 7, 2017

Related U.S. Application Data (63) Continuation of application No. PCT/CN2016/075228, filed on Mar. 1, 2016.

(51) Int. Cl.
| | |
|---|---|
| H02J 7/04 | (2006.01) |
| H02J 7/16 | (2006.01) |
| H02J 7/00 | (2006.01) |
| G01R 31/36 | (2006.01) |
| G01R 31/44 | (2006.01) |

(52) U.S. Cl.
CPC .......... *H02J 7/007* (2013.01); *G01R 31/3624* (2013.01); *G01R 31/44* (2013.01); *H02J 7/0004* (2013.01); *H02J 7/0047* (2013.01); *H02J 7/0091* (2013.01); *H02J 7/047* (2013.01); *H02J 2007/005* (2013.01); *H02J 2007/0096* (2013.01); *H02J 2007/0098* (2013.01)

(58) Field of Classification Search
CPC ..................................................... H02J 7/0091
USPC ........................................................... 320/153
See application file for complete search history.

(56) References Cited

U.S. PATENT DOCUMENTS

| | | | |
|---|---|---|---|
| 5,508,599 A | 4/1996 | Koenck | |
| 5,945,853 A * | 8/1999 | Sano | G01R 19/0092 327/307 |

(Continued)

FOREIGN PATENT DOCUMENTS

| | | |
|---|---|---|
| CN | 102957193 A | 3/2013 |
| CN | 103051027 A | 4/2013 |

(Continued)

OTHER PUBLICATIONS

Extended European search report issued in corresponding European application No. 16818966.0 dated Mar. 19, 2018.

(Continued)

*Primary Examiner* — Yalkew Fantu
(74) *Attorney, Agent, or Firm* — Young Basile Hanlon & MacFarlane, P.C.

(57) ABSTRACT

A charging method, a power adapter, a mobile terminal, and a charging system are provided. The power adapter communicates with the mobile terminal bidirectionally to obtain current state parameters of a battery of the mobile terminal, and adjust a charging parameter of the power adapter in real time based on the current state parameters of the battery.

21 Claims, 7 Drawing Sheets

(56) References Cited

U.S. PATENT DOCUMENTS

| | | | | |
|---|---|---|---|---|
| 6,107,779 | A * | 8/2000 | Hara | G01R 31/3613 |
| | | | | 320/132 |
| 6,958,590 | B1 * | 10/2005 | Vaananen | H01M 10/46 |
| | | | | 320/150 |
| 7,737,657 | B2 | 6/2010 | Fischer et al. | |
| 8,271,217 | B2 * | 9/2012 | Ahmed | G01R 31/3624 |
| | | | | 702/63 |
| 8,305,070 | B2 * | 11/2012 | Vulih | H02M 3/1584 |
| | | | | 323/282 |
| 2008/0024089 | A1 | 1/2008 | Meng et al. | |
| 2008/0218124 | A1 * | 9/2008 | Yang | H01M 2/1066 |
| | | | | 320/113 |
| 2012/0105014 | A1 | 5/2012 | Nakayama et al. | |
| 2014/0159920 | A1 * | 6/2014 | Furui | B25F 5/02 |
| | | | | 340/870.07 |
| 2016/0006272 | A1 | 1/2016 | Greening | |

FOREIGN PATENT DOCUMENTS

| | | |
|---|---|---|
| CN | 103117421 A | 5/2013 |
| CN | 103414223 A | 11/2013 |
| CN | 103795040 A | 5/2014 |
| CN | 204046202 U | 12/2014 |
| CN | 104377781 A | 2/2015 |
| CN | 104393627 A | 3/2015 |
| CN | 104659866 A | 5/2015 |
| CN | 104967201 A | 10/2015 |
| JP | 2014121140 A | 6/2014 |

OTHER PUBLICATIONS

International Search Report issued in PCT Application No. PCT/CN2016/075228, dated Dec. 6, 2016, 5 pages.

* cited by examiner

CHARGING METHOD, POWER ADAPTER, MOBILE TERMINAL, AND CHARGING SYSTEM

CROSS REFERENCE TO RELATED APPLICATIONS

This application is a continuation application of PCT Patent Application No. PCT/CN2016/075228, entitled "CHARGING METHOD, POWER ADAPTER, MOBILE TERMINAL, AND CHARGING SYSTEM", filed on Mar. 1, 2016, which is hereby incorporated in its entireties by reference.

TECHNICAL FIELD

The present disclosure relates to charging field, and particularly to a charging method, a power adapter, a mobile terminal, and a charging system.

BACKGROUND

Presently, mobile terminals (e.g., smart phones) become more and more popular with consumers. However, the power consumption of mobile terminals is great, thus mobile terminals need to be charged frequently.

In the present technology, a charging mode of the power adapter can be a constant current mode, a constant voltage mode, or a pulse mode. Once the charging mode of the power adapter is determined, the power adapter will charge a mobile terminal in the charging mode. Such a charging manner is not flexible, and the charging effect is not good.

SUMMARY

The embodiments of the present disclosure provide a charging method, a power adapter, a mobile terminal, and a charging system, which can improve flexibility of a charging process of a mobile terminal.

In a first aspect, a charging method is provided. The charging method is configured for charging a battery of a mobile terminal via a power adapter. The method comprises: obtaining current state parameters of the battery, wherein the current state parameters indicate the current temperature of the battery and the current state of charge of the battery; determining a mapping relationship from one or more of mapping relationships based on the current temperature of the battery, wherein the one or more of the mapping relationships correspond to the different temperatures of the battery, each of the one or more of the mapping relationships indicates a mapping relationship between the state of charge of the battery and a charging parameter of the battery under a preset temperature of the battery, the charging parameter comprises at least one of a charging voltage from the power adapter, a charging current from the power adapter, and a charging mode of the power adapter, and the charging mode comprises at least one of constant voltage charging stage, constant current charging stage, and pulse charging stage; determining the current charging parameter of the battery based on the determined mapping relationship and the current state of charge of the battery; and charging the battery of the mobile terminal according to the current charging parameter.

The power adapter communicates with the mobile terminal to obtain the current state parameters of the battery, so as to adjust the charging parameter during the charging process (for example, adjust an output voltage, an output current, and a charging mode of the power adapter), which improves flexibility of the charging process.

In a second aspect, a charging method is provided. The method comprises: obtaining current state parameters of a battery of the mobile terminal, wherein the current state parameters of the battery indicates the current temperature of the battery and the current state of charge of the battery; determining a mapping relationship from one or more of mapping relationships based on the current temperature of the battery, wherein the one or more of the mapping relationships correspond to the different temperatures of the battery, each of the one or more of the mapping relationships indicates a mapping relationship between the state of charge of the battery and a charging parameter of the battery under a preset temperature of the battery, the charging parameter comprises at least one of a charging voltage from the power adapter, a charging current from the power adapter, and a charging mode of the power adapter, and the charging mode comprises at least one of constant voltage charging stage, constant current charging stage, and pulse charging stage; determining the current charging parameter based on the determined mapping relationship and the current state of charge of the battery; and transmitting the current charging parameter to the power adapter, so as to cause the power adapter to charge the battery according to the current charging parameter.

The power adapter communicates with the mobile terminal to obtain the current state parameters of the battery, so as to adjust the charging parameter during the charging process, which improves flexibility of the charging process.

In a third aspect, a power adapter is provided. The power adapter includes circuits configured to execute the method of the first aspect.

In a fourth aspect, a mobile terminal is provided. The mobile terminal includes circuits configured to execute the method of the second aspect.

In a fifth aspect, a charging system is provided. The charging system includes a power adapter of the third aspect, and a mobile terminal of the fourth aspect.

In the present disclosure, the power adapter can communicate with the mobile terminal, and adjust the charging parameter according to the current state parameters of the battery, which can improve flexibility of the charging process of the mobile terminal.

BRIEF DESCRIPTION OF THE DRAWINGS

To better illustrate the technical solution of embodiments of the present disclosure, the following descriptions will briefly illustrate the accompanying drawings described in the embodiments of the present disclosure.

DETAILED DESCRIPTION

In combination with the first aspect, in a first implementation manner of the first aspect, the charging process of the battery at the current temperature comprises multiple charging phases (or, the charging process is divided into multiple charging phases). The states of charge of the battery at different charging phases of the multiple charging phases are different, and the determined mapping relationship comprises a one-to-one mapping relationship between the multiple charging phases and multiple charging parameters. Determining the current charging parameter based on the determined mapping relationship and the current state of charge of the battery comprises: determining the current charging phase from the multiple charging phases based on the current state of charge; and determining one of the multiple charging parameters corresponding to the current charging phase to be the current charging parameter.

The charging process is divided into multiple charging phases, and each charging phase is assigned with a proper charging parameter, which can further improve flexibility of the charging process.

In combination with the first implementation manner of the first aspect, in a second implementation manner of the first aspect, the multiple charging phases comprise a first charging phase and a second charging phase, and the charging mode of the first charging phase is different from that of the second charging phase. It can be understood that the first charging phase and the second charging phase are any two of the multiple charging phases.

Different charging phases are respectively assigned with proper charging modes, and not only one charging mode is used, which can further improve flexibility of the charging process.

In combination with the first aspect or any of the above implementation manners, in a third implementation manner of the first aspect, before obtaining the current state parameters of the battery from the mobile terminal, the method further comprises: communicating with the mobile terminal to determine a charging mode, wherein the charging mode comprises a quick charging mode and a normal charging mode, and a charging speed of the quick charging mode is greater than that of the normal charging mode. Obtaining the current state parameters of the battery from the mobile terminal when the quick charging mode is determined to be used to charge the battery comprises: communicating with the mobile terminal to determine a charging voltage and a charging current of the quick charging mode. Charging the battery of the mobile terminal according to the current charging parameter when the quick charging mode is determined to be used to charge the battery comprises: adjusting an output voltage and an output current of the power adapter to be the charging voltage and the charging current of the quick charging mode according to the current charging parameter, so as to charge the mobile terminal in the quick charging mode.

In a process of coupling the power adapter to the mobile terminal, multiple handshake communications occur between the power adapter and the mobile terminal, which can ensure safety of the whole charging process.

In combination with the second aspect, in a first implementation manner of the second aspect, a charging process of the battery at the current temperature comprises multiple charging phases, the states of charge of the battery at different charging phases of the multiple charging phases are different, and the target parameter mapping relationship comprises a one-to-one mapping relationship between the multiple charging phases and multiple charging parameters. Determining the current charging parameter based on the determined mapping relationship and the current state of charge of the battery comprises: determining the current charging phase from the multiple charging phases based on the current state of charge; and determining one of the multiple charging parameters corresponding to the current charging phase to be the current charging parameter.

In combination with the first implementation manner of the second aspect, in a second implementation manner of the second aspect, the multiple charging phases comprise a first charging phase and a second charging phase, and the charging mode of the first charging phase is different from that of the second charging phase.

In combination with the second aspect or any of the above implementation manners, in a third implementation manner of the second aspect, before obtaining the state parameters of the battery by the mobile terminal, the method further comprises: communicating with the power adapter to determine a charging mode, wherein the charging mode comprises a quick charging mode and a normal charging mode, and a charging speed of the quick charging mode is greater than that of the normal charging mode; communicating with the power adapter to determine a charging voltage and a charging current of the quick charging mode when the quick charging mode is determined to be used. Communicating with the power adapter to transmit the current charging parameter to the power adapter comprises: communicating with the power adapter to transmit the current charging parameter to the power adapter, so as to cause the power adapter to adjust an output voltage and an output current of the power adapter to be the charging voltage and the charging current of the quick charging mode after receiving the current charging parameter from the mobile terminal, and charge the mobile terminal in the quick charging mode.

In some of the above implementation manners, the one or more of the mapping relationships are determined based on variation relationships that maximum charge rates of the battery at multiple temperatures vary with the states of charge of the battery. Selecting the one or more of the mapping relationships can cause the charge rates of the battery during the whole charging process to be close to the maximum charge rates.

In some of the above implementation manners, the parameter configured to indicate the current state of charge of the battery is the current state of charge of the battery or the current voltage of the battery.

In some of the above implementation manners, the charging mode of at least one of the multiple charging phases is the pulse charging stage.

In some of the above implementation manners, the pulse charging stage comprises at least one of positive pulse charging stage, negative pulse charging stage, and positive-negative pulse charging stage.

In some of the above implementation manners, a charging current of the pulse charging stage is a constant current or a variable current.

To adjust charging parameters (charging voltage, charging current, charging mode, and so on) in real time according to state parameters (temperature, state of charge, voltage, and so on) of a battery, in embodiments of the present disclosure multiple parameter mapping relationships are established beforehand. The multiple parameter mapping relationships respectively correspond to multiple temperatures, and each parameter mapping relationship is configured to indicate a mapping relationship between states of charge and charging parameters of the battery at the temperature corresponding to the parameter mapping relationship.

In actual use, a target parameter mapping relationship corresponding to a current temperature of the battery can be selected from the multiple parameter mapping relationships based on the current temperature of the battery, and then a current charging parameter is determined according to the state of charge of the battery and the target parameter mapping relationship.

It can be understood that information of the multiple parameter mapping relationships can be stored in a power adapter, and can also be stored in a mobile terminal, and it depends on that whether it is the power adapter or the mobile terminal to determine the charging parameter. For example, the mobile terminal can be in charge of detecting the state parameters of the battery, and transmit the state parameters of the battery to the power adapter via data lines of the USB interface. The power adapter acts as a host for determining the charging parameter, and determines the current charging parameter according to the state parameters of the battery and the information of the multiple parameter mapping relationships stored in the power adapter. Or the mobile terminal can act as a host for determining the charging parameter. The mobile terminal is not only in charge of detecting the state parameters of the battery, but also in charge of determining the current charging parameter according to the state parameters of the battery and the information of the multiple parameter mapping relationships stored in the mobile terminal, and then transmits the current charging parameter to the power adapter.

It can be understood that in the embodiments of the present disclosure the multiple parameter mapping relationships are determined based on variation relationships that maximum charge rates of the battery at multiple temperatures vary with the states of charge of the battery. The variation relationships that maximum charge rates vary with states of charge of the battery can be indicated by a maximum charge rate curve. For example, to determine the parameter mapping relationship corresponding to 15 degrees centigrade, the maximum charge rate curve of the battery at 15 degrees centigrade can be firstly determined (a method for determining the maximum charge rate curve will be specifically described hereinafter), and then the charging parameter corresponding to each state of charge can be selected based on the maximum charge rate curve. A principle of selecting the charging parameter can be following: when the power adapter charges the battery which temperature is 15 degrees centigrade according to the charging parameter, the charge rates during the whole charging process are as close to the maximum charge rate curve corresponding to 15 degrees centigrade as possible.

The following describes a charging method of an embodiment of the present disclosure in combination with detailed examples (including a process of determining the parameter mapping relationship).

Figure 1:
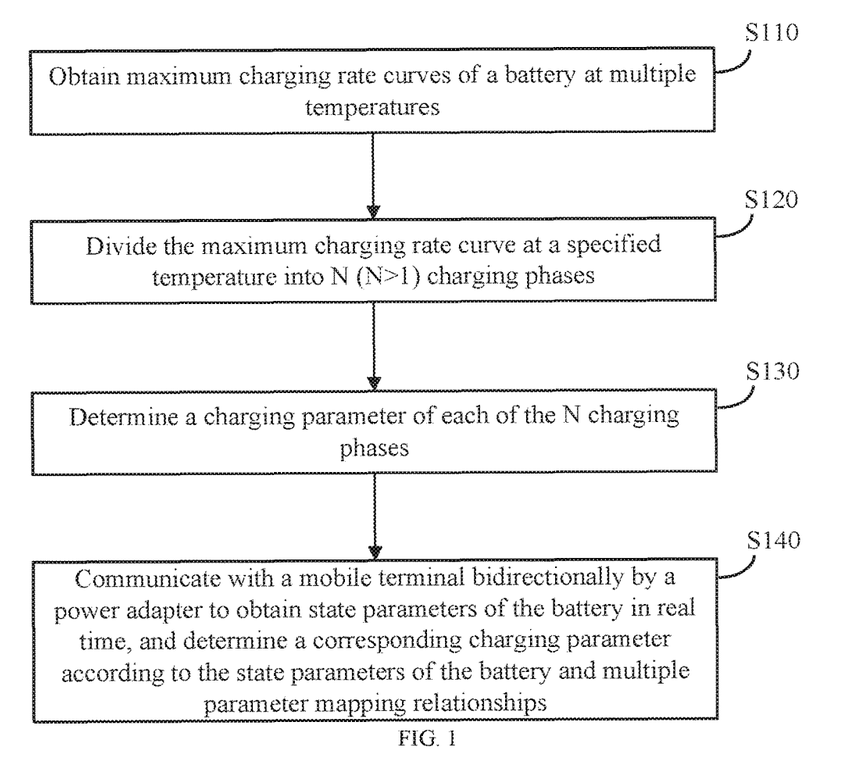
FIG. 1 is a schematic flow chart of a charging method in accordance with an embodiment of the present disclosure.

FIG. 1 is a schematic flow chart of a charging method in accordance with an embodiment of the present disclosure. The method of FIG. 1 includes following.

S110, maximum charge rate curves of the battery at multiple temperatures are obtained.

Specifically, during a process of charging a lithium ion battery, a potential of a cathode of the battery continues to rise, and a potential of an anode of the battery continues to decrease. When the potential of the anode is less than 0V, Li+ will be precipitated at the anode to form lithium dendrites, that is, "lithium precipitation". Lithium precipitation can not only affect electrochemical performance of the battery, but also can decrease safety of the battery. Therefore, during a process of using the battery, occurrence of lithium precipitation of the battery needs to be avoided to the greatest extent. Generally, the lower the temperature is, the greater the charge rate is, and the more likely it is that lithium precipitation of the lithium ion battery occurs.

A user/a battery manufacture/a terminal manufacture can obtain maximum charge rate curves of the battery at multiple temperatures by way of a three electrodes method. A measurement process of the three electrodes method generally includes following. Firstly, a lithium electrode is embedded between the cathode and anode of the battery to act as a reference electrode. Secondly, the temperature and the charge rate of the battery are fixed. During a charge-discharge process of the battery, the potential of the cathode and the potential of the anode are monitored in real time. When the potential of the anode is 0V, lithium precipitation will occur at the anode, and at this point the state of charge of the battery (hereinafter, lithium precipitation SOC) is recorded. By measurement, lithium precipitation SOC of the battery at different temperatures and different charge rates can be obtained, that is, the maximum charge rate curves of the battery at different temperatures can be obtained.

For example, table 1 shows a corresponding relationship between charge rates and lithium precipitation SOC of a certain battery at a normal temperature (the normal temperatures of the battery range from 10□ to 35° C., for example, the normal temperature is 20° C.).

TABLE 1

| Charge rate | SOC |
| --- | --- |
| 1.5 C. | 60% |
| 1.0 C. | 75% |
| 0.8 C. | 85% |
| . . . | . . . |

Figure 2:
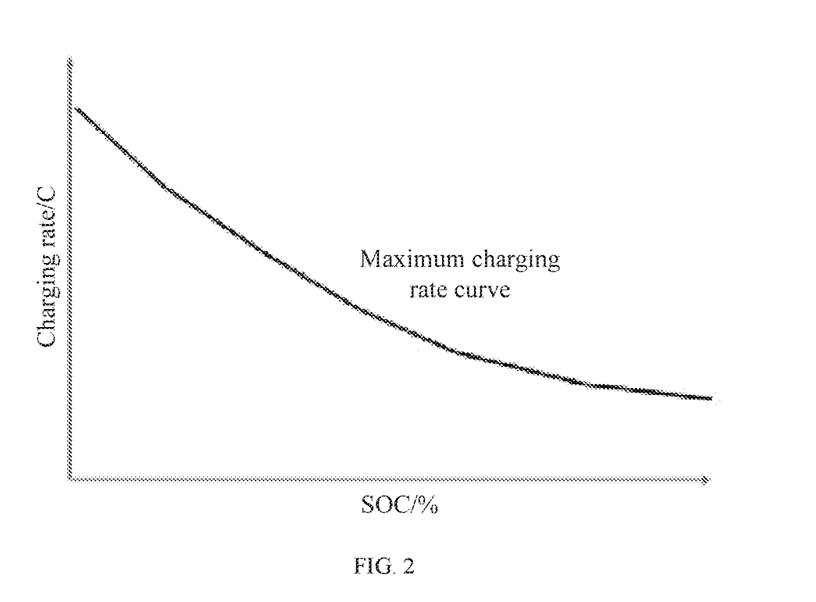
FIG. 2 is a schematic view of a maximum charge rate curve at a normal temperature.

Based on data of table 1, a maximum charge rate curve of the battery at a normal temperature can be drawn, which is shown in FIG. 2. At the same temperature, the more the measured rate points are, the more accurate the obtained maximum charge rate curve is.

Figure 3:
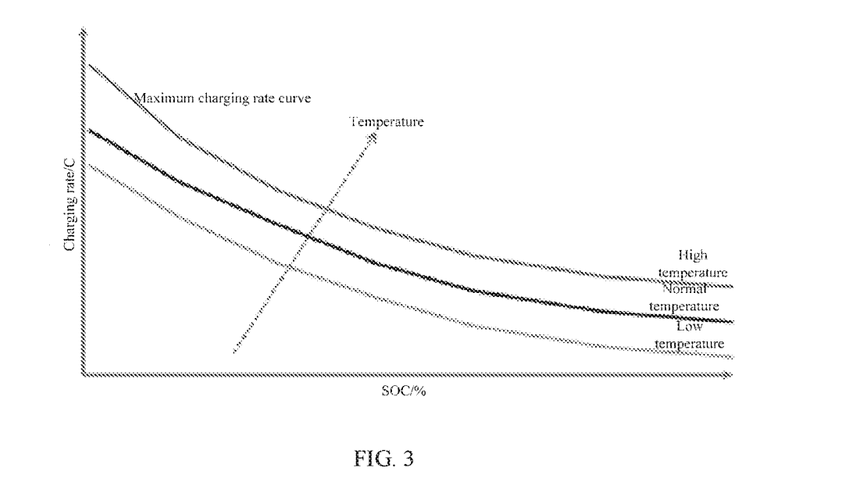
FIG. 3 is a schematic view showing maximum charge rate curves at multiple temperatures.

Next, in the same manner, the maximum charge rate curves of the battery at multiple temperatures can be measured. For example, the maximum charge rate curves of the battery at a high temperature (for example, 50 degrees centigrade), at a normal temperature (for example, 20 degrees centigrade), and at a low temperature (for example, −5 degrees centigrade) can be measured, which are shown in FIG. 3.

After the maximum charge rate curves at multiple temperatures are obtained, the charging parameter mapping relationships at multiple temperatures (that is, mapping relationships between SOC and charging parameters) can be obtained based on the maximum charge rate curves. Different SOC can correspond to different charging parameters. A selected charging parameter can cause the charge rate curve during the whole charging process to be as close to the maximum charge rate curve as possible, which can ensure security of charging, and can also increase charging speed. Optionally, for simple computation, the maximum charge rate curve can be divided into multiple charging phases, and each charging phase uses a charging parameter, which will be specifically described in step 120 and step 130.

Figure 4:
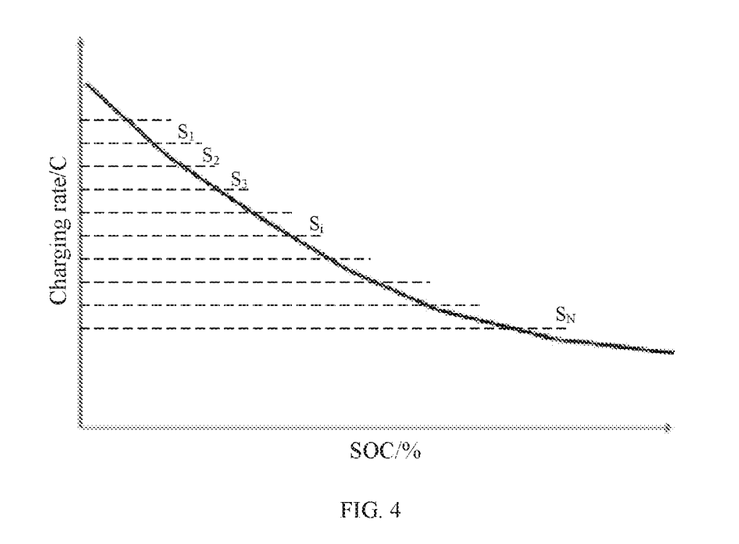
FIG. 4 is a schematic view of a maximum charge rate curve, the maximum charge rate curve including multiple charging phases.

S120, the maximum charge rate curve at a specified temperature is divided into N (N>1) charging phases, which is shown in FIG. 4.

S130, a charging parameter of each of the N charging phases is determined.

For example, one or more of a charging mode, a charging current, and a charging voltage can be determined for each charging phase. For example, during the whole charging process, when the constant voltage charging is adopted, the charging parameter of each charging phase can include a charging current, when the constant current charging is adopted, the charging parameter of each charging phase can include a charging voltage, and when multiple charging modes can be adopted, the charging parameter of each charging phase can include a charging mode. A principle of selecting a charging parameter of each charging phase is following: when the battery is charged according to the charging parameter, the charge rate of the battery is as close to the currently allowed maximum charge rate as possible. The following will give examples of manners for selecting a charging parameter of each charging phase.

Figure 5:
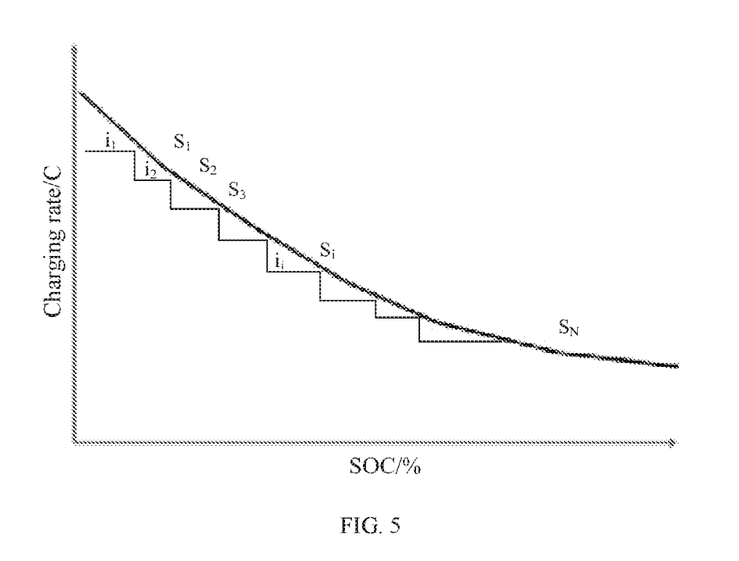
FIG. 5 is a schematic view showing an actual charge rate curve and a maximum charge rate curve under a constant current mode.
Figure 6:
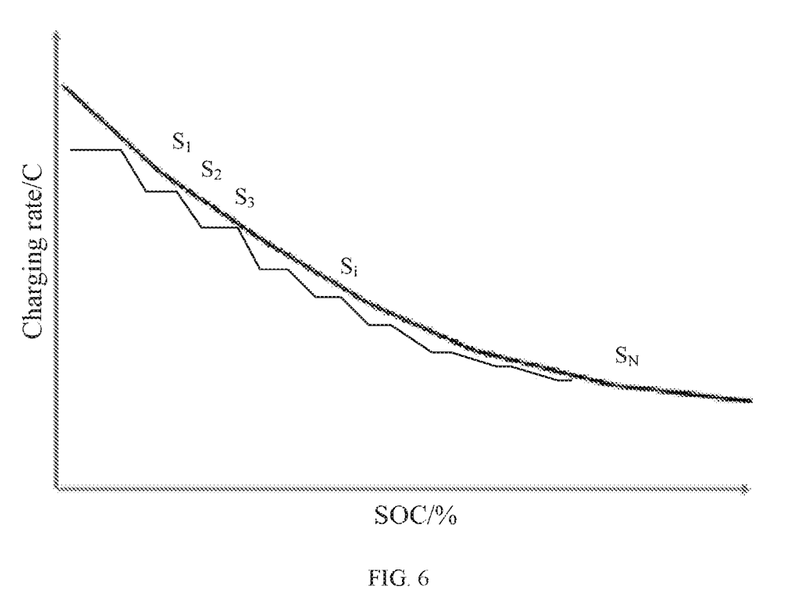
FIG. 6 is a schematic view showing an actual charge rate curve and a maximum charge rate curve under a constant current mode and a constant voltage mode.

As shown in FIG. 5, the N charging phases can adopt the constant current charging mode, and currents of different charging phases are different. From FIG. 5 it can be seen that the selected charging current of each charging phase can cause the actual charge rate curve to be as close to the maximum charge rate curve as possible without exceeding the maximum charging curve. Similarly, in FIG. 6, in each charging phase the constant current charging mode and the constant voltage charging mode are adopted. A principle of selecting the charging parameter is the same as that of FIG. 5.

Furthermore, one or more of the N charging phases can further adopt a pulse charging mode. Comparing with the typical constant current charging mode and the typical constant voltage mode, by way of adopting pulse charging, the charging time can be greatly reduced. When a large current pulse charging is adopted, at the stop moment of a pulse, by stopping charging for a proper time, or by providing a negative pulse for a short time, a polarization generated during the charging process of the battery can be further effectively restrained, accordingly a charging efficiency can be increased. The pulse charging mode can include a constant current pulse, a variable current pulse, and a positive and negative pulse, and so on. Different charging phases can adopt the same pulse charging mode, and can also adopt different pulse charging modes. Furthermore, the N charging phases can adopt one or more of the above charging modes, and the embodiment of the present disclosure is not limited to these. The following describes specific forms of pulse currents which can be used by the pulse charging mode in combination with FIGS. 7-10.

Figure 7:
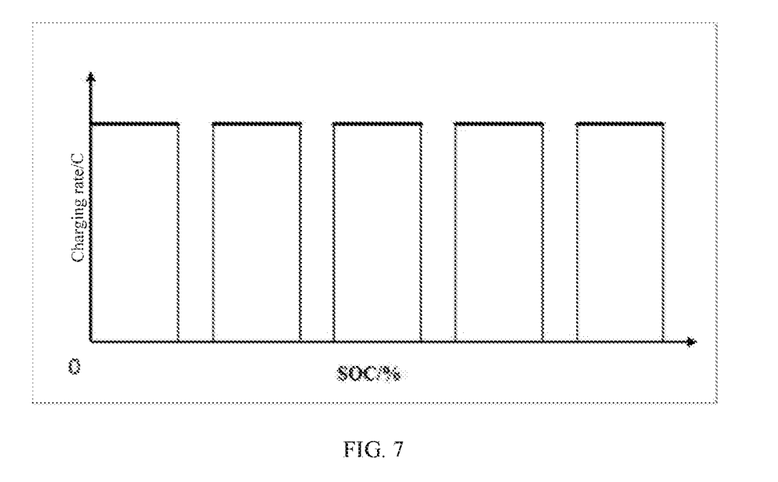
FIG. 7 is a schematic view of a specific form of a pulse charging current.
Figure 8:
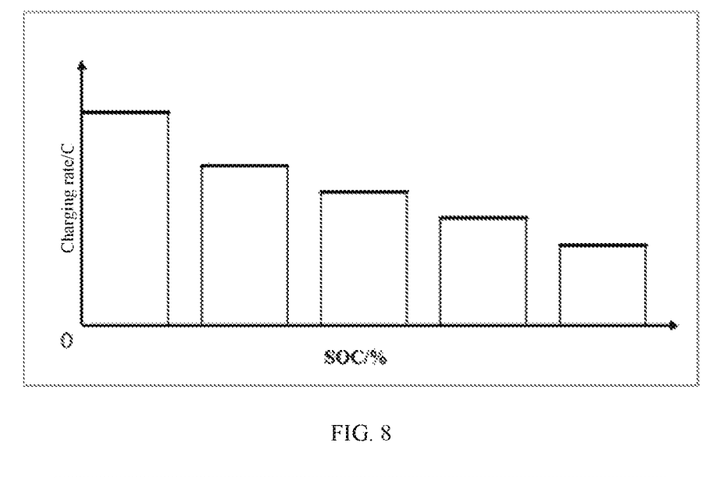
FIG. 8 is a schematic view of a specific form of a pulse charging current.

Pulse currents of FIG. 7 and FIG. 8 are in a form of a combination of a pulse signal and a proper time of stopping charging. A difference between FIG. 7 and FIG. 8 is that the pulse signal of FIG. 7 is a constant current pulse signal, and the pulse signal of FIG. 8 is a variable current pulse signal. For the pulse current which is in the form of a combination of a pulse signal and a proper time of stopping charging, stopping charging for a proper time can cause the battery to be in a relaxation process, and the relaxation process can slow down occurrence of the lithium precipitation phenomenon.

Figure 9:
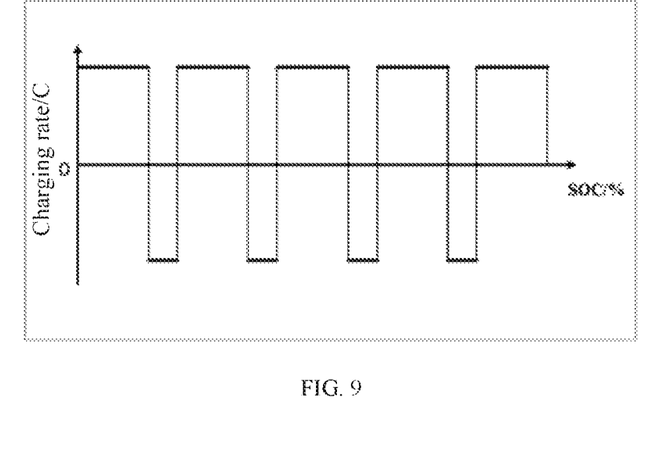
FIG. 9 is a schematic view of a specific form of a pulse charging current.
Figure 10:
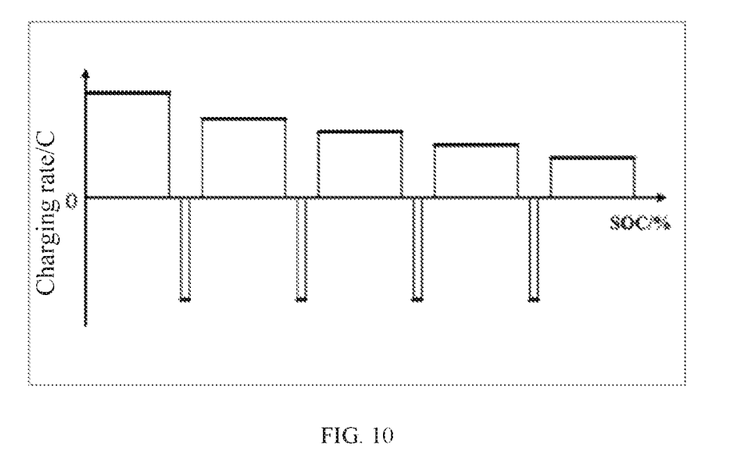
FIG. 10 is a schematic view of a specific form of a pulse charging current.

A pulse current of FIG. 9 is in a form of a combination of a positive pulse signal and a short negative pulse signal. Adopting the negative pulse signal to charge the battery is the same as that the battery discharges actively, and can speed up the relaxation process of the battery. Comparing with the stopping charging manners of FIG. 7 and FIG. 8, the negative pulse can reduce the relaxation time, and greatly slow down occurrence of the lithium precipitation phenomenon. In FIG. 9, the positive pulse signal is taken as the constant current pulse signal, and the positive pulse signal can be a variable current pulse signal. FIG. 10 shows a combination of the above pulse currents, which will not be specifically described herein.

S140, the power adapter communicates with the mobile terminal bidirectionally to obtain state parameters of the battery in real time, and a corresponding charging parameter is determined according to the state parameters of the battery and the multiple parameter mapping relationships.

It can be understood offline determination can be used in step 110, step 120, and step 130. In actual interaction, the charging parameter mapping relationship determined by step 110, step 120, and step 130 can be directly used.

In the embodiment of the present disclosure, on the premise of ensuring performance and safety of the battery, the charging speed and the charging efficiency can be increased to a greatest extent, and accordingly the charging time is reduced.

The above specifically describes the charging method of the embodiment of the present disclosure in combination with FIGS. 1-10. The following will specifically describe the power adapter and the mobile terminal in combination with FIG. 11 and FIG. 12. It can be understood that terms and features described in devices are similar to that described in the method. For simplicity, repeated descriptions will be appropriately omitted.

Figure 11:
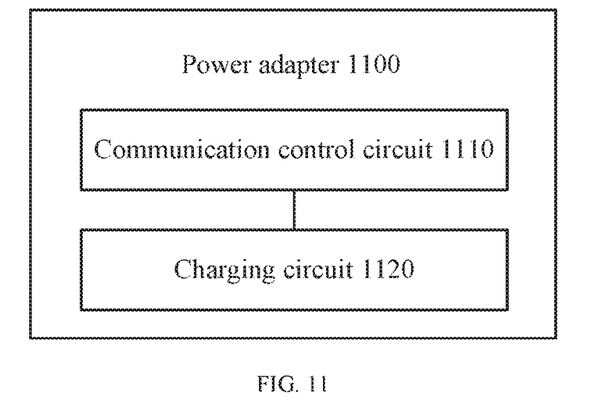
FIG. 11 is a diagrammatic view of a power adapter in accordance with an embodiment of the present disclosure.

FIG. 11 is a diagrammatic view of a power adapter in accordance with an embodiment of the present disclosure. The power adapter 1100 of FIG. 11 includes a communication control circuit 1110 and a charging circuit 1120. The communication control circuit 1110 is configured to communicate with the mobile terminal after the power adapter 1100 is coupled to the mobile terminal via a charging interface, so as to obtain state parameters of a battery of the mobile terminal from the mobile terminal. The power adapter 1100 charges the battery via power lines of the charging interface, and communicates with the mobile terminal via data lines of the charging interface. The state parameters of the battery include a parameter configured to indicate a current temperature of the battery, and a parameter configured to indicate a current state of charge of the battery. The communication control circuit 1110 is further configured to select a target parameter mapping relationship corresponding to the current temperature of the battery from preset multiple parameter mapping relationships according to the current temperature of the battery. The multiple parameter mapping relationships respectively correspond to multiple temperatures, and each of the parameter mapping relationships is configured to indicate a mapping relationship between the state of charge of the battery and a charging parameter of the battery at a temperature corresponding to the each of the parameter mapping relationship. The charging parameter includes at least one of an output voltage of the power adapter 100, an output current of the power adapter 100, and a charging mode of the power adapter 1100, and the charging mode includes at least one of constant voltage charging stage, constant current charging stage, and pulse charging stage. The communication control circuit 1110 is further configured to determine a current charging parameter according to the current state of charge of the battery and the target parameter mapping relationship, and charge the battery of the mobile terminal according to the current charging parameter via the charging circuit 1120.

Optionally, in an embodiment, a charging process of the battery at the current temperature includes multiple charging phases, the states of charge of the battery at different charging phases of the multiple charging phases are different, and the target parameter mapping relationship includes a one-to-one mapping relationship between the multiple charging phases and multiple charging parameters. The communication control circuit 1110 is further configured to determine the current charging phase from the multiple charging phases based on the current state of charge, and determine one of the multiple charging parameters corresponding to the current charging phase to be the current charging parameter.

Optionally, in an embodiment, the multiple charging phases include a first charging phase and a second charging phase, and a charging mode of the first charging phase is different from that of the second charging phase.

Optionally, in an embodiment, the communication control circuit 1110 is further configured to communicate with the mobile terminal to determine a charging mode. The charging mode includes a quick charging mode and a normal charging mode, and a charging speed of the quick charging mode is greater than that of the normal charging mode. The communication control circuit 1110 is further configured to communicate with the mobile terminal to determine a charging voltage and a charging current of the quick charging mode when the quick charging mode is determined to be used for charging the battery, and adjust an output voltage and output current of the power adapter to be the charging voltage and the charging current of the quick charging mode according to the current charging parameter, so as to charge the mobile terminal in the quick charging mode.

Optionally, in an embodiment, the quick charging mode at least satisfies a following requirement: during a charging period that the battery capacity increases from a rated capacity of 0% to a rated capacity of 80%, an average charging power of the battery should be greater than 15 W.

Optionally, in an embodiment, the multiple parameter mapping relationships are determined based on variation relationships that maximum charge rates of the battery at multiple temperatures vary with the states of charge of the battery.

Optionally, in an embodiment, the parameter configured to indicate the current state of charge of the battery is the current state of charge of the battery or a current voltage of the battery.

Figure 12:
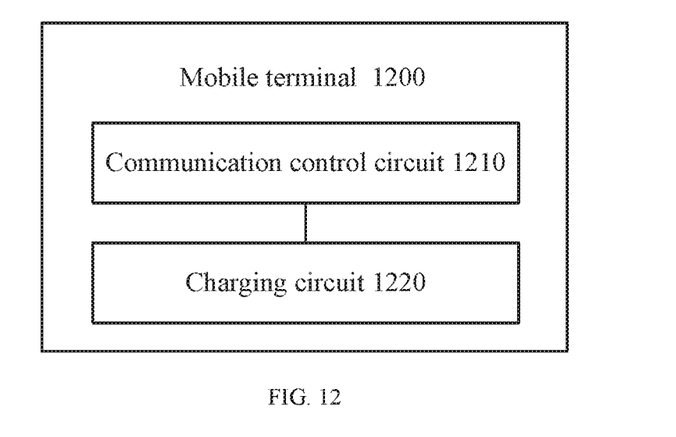
FIG. 12 is a diagrammatic view of a mobile terminal in accordance with an embodiment of the present disclosure.

FIG. 12 is a diagrammatic view of a mobile terminal in accordance with an embodiment of the present disclosure. A mobile terminal 1200 of FIG. 12 includes a communication control circuit 1210 and a charging circuit 1220. The communication control circuit 1210 is configured to obtain state parameters of a battery of the mobile terminal 1200 after the mobile terminal 1200 is coupled to a power adapter via a charging interface. The power adapter charges the battery via power lines of the charging interface, and the mobile terminal 1200 communicates with the power adapter via data lines of the charging interface. The state parameters of the battery include a parameter configured to indicate a current temperature of the battery, and a parameter configured to indicate a current state of charge of the battery. The communication control circuit 1210 is further configured to select a target parameter mapping relationship corresponding to the current temperature of the battery from preset multiple parameter mapping relationships according to the current temperature of the battery. The multiple parameter mapping relationships respectively correspond to multiple temperatures, each of the parameter mapping relationships is configured to indicate a mapping relationship between the state of charge of the battery and the charging parameter of the battery at a temperature corresponding to the each of the parameter mapping relationships. The charging parameter includes at least one of an output voltage of the power adapter, an output current of the power adapter, and a charging mode of the power adapter, and the charging mode includes at least one of constant voltage charging stage, constant current charging stage, and pulse charging stage. The communication control circuit 1210 is further configured to determine a current charging parameter according to the current state of charge of the battery and the target parameter mapping relationship, and communicate with the power adapter to transmit the current charging parameter to the power adapter, so as to cause the power adapter to charge the battery according to the current charging parameter via the charging circuit 1220.

Optionally, in an embodiment, a charging process of the battery at the current temperature includes multiple charging phases, and the states of charge of the battery at different charging phases of the multiple charging phases are different. The target parameter mapping relationship includes a one-to-one mapping relationship between the multiple charging phases and multiple charging parameters. The communication control circuit 1210 is configured to determine the current charging phase from the multiple charging phases based on the current state of charge, and determine one of the multiple charging parameters corresponding to the current charging phase to be the current charging parameter.

Optionally, in an embodiment, the multiple charging phases include a first charging phase and a second charging phase, and a charging mode of the first charging phase is different from that of the second charging phase.

Optionally, in an embodiment, the communication control circuit 1210 is further configured to communicate with the power adapter to determine a charging mode. The charging mode includes a quick charging mode and a normal charging mode, and a charging speed of the quick charging mode is greater than that of the normal charging mode. The communication control circuit 1210 is configured to communicate with the power adapter to determine a charging voltage and a charging current of the quick charging mode when the quick charging mode is determined to be used, and communicate with the power adapter to transmit the current charging parameter to the power adapter, so as to cause the power adapter to adjust an output voltage and output current of the power adapter to be the charging voltage and the charging current of the quick charging mode upon receiving the current charging parameter from the mobile terminal 1200, and charge the mobile terminal 1200 in the quick charging mode.

Optionally, in an embodiment, the multiple parameter mapping relationships are determined based on variation relationships that maximum charge rates of the battery at multiple temperatures vary with the states of charge of the battery.

Optionally, in an embodiment, the parameter configured to indicate the current state of charge of the battery is the current state of charge of the battery or a current voltage of the battery.

Figure 13:
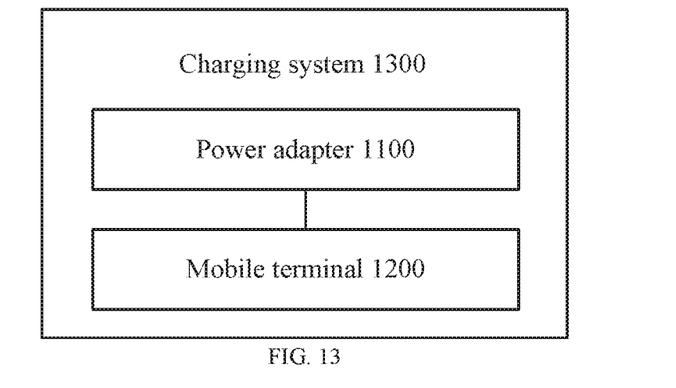
FIG. 13 is a diagrammatic view of a communication system in accordance with an embodiment of the present disclosure.

FIG. 13 is a diagrammatic view of a communication system in accordance with an embodiment of the present disclosure. A communication system 1300 of FIG. 13 includes the power adapter 1100 of FIG. 11 and the mobile terminal 1200 of FIG. 12.

Those skilled in the art should appreciate that units and programming steps of various examples described in the embodiments of the present disclosure can be realized by electronic hardware or a combination of computer software and electronic hardware. Whether these functions are realized by hardware or software depends on particular applications and design constraint conditions. For each particular application, professionals can employ different methods to realize described functions, but this realization should fall into the scope of the present disclosure.

For convenience and simplicity, those skilled in the art can clearly understand that when the specific work processes of the above described systems, devices, and units are described, the corresponding processes of the above method embodiments can be referred, which will not be repeated herein.

In several embodiments provided by the present disclosure, it can be understood that the disclosed systems, devices, and methods can be implemented by other manners. For example, the device embodiments described above are only schematic. For example, the units are divided according to logic functions and can be divided by another manner in an actual implementation. For example, several units or assemblies can be combined or can be integrated into another system, or some features can be ignored, or are not executed. Another point is that mutual coupling or direct coupling or communication connection shown or discussed herein can be indirect coupling or communication connection through certain interfaces, devices, or units, and can be in the form of electricity, machine, or other.

The units illustrated as separate units can be or cannot be physically separated, and components shown in units can be or cannot be physical units, that is, can be in a place, or can be distributed in several network units. A part of or all of the units can be selected according to actual need to realize the purpose of the solution of the embodiments.

Additionally, various functional units in the embodiments of the present disclosure can be integrated into one processing unit, or various functional units can exist alone, or two or more units can be integrated into one unit.

If the functions can be realized in the form of software functional units and can be sold or used as stand-alone products, they can be stored in a computer-readable storage medium. Based on such understanding, the technical solution of the present disclosure or the part that contributes to the existing technology or a part of the technical solution can be embodied in the form of a software product. The computer software product can be stored in a storage medium, and include a plurality of instructions configured to direct a computer device (personal computer, server, or network device) to execute all of or a part of steps of various embodiments of the present disclosure. The storage mediums described above include a U disk, a mobile disk, a read-only memory (ROM), a random access memory (RAM), a disc, a compact disc, or other medium storing program codes.

The foregoing descriptions are merely preferred embodiments of the present disclosure, rather than limiting the present disclosure. Any one skilled in the art can easily make change or alterations within the technology range of the present disclosure, and those change or alterations shall fall within the protection scope of the present disclosure. Therefore, the protection scope of the present disclosure shall be limited by the protection scope of the claims.

What is claimed is:

1. A charging method for charging a battery of a mobile terminal via a power adapter, the method comprising:
   obtaining current state parameters of the battery, wherein the current state parameters indicate the current temperature of the battery and the current state of charge of the battery;
   determining a mapping relationship from one or more of mapping relationships based on the current temperature of the battery, wherein the one or more of the mapping relationships correspond to the different temperatures of the battery, each of the one or more of the mapping relationships indicates a mapping relationship between the state of charge of the battery and a charging parameter of the battery under a preset temperature of the battery, the charging parameter comprises at least one of a charging voltage from the power adapter, a charging current from the power adapter, and a charging mode of the power adapter, and the charging mode comprises at least one of constant voltage charging stage, constant current charging stage, and pulse charging stage;
   determining the current charging parameter of the battery based on the determined mapping relationship and the current state of charge of the battery; and
   charging the battery of the mobile terminal according to the current charging parameter.

2. The method of claim 1, wherein a charging process of the battery at the current temperature comprises multiple charging phases, the states of charge of the battery at different charging phases of the multiple charging phases are different, the determined mapping relationship comprises a one-to-one mapping relationship between the multiple charging phases and multiple charging parameters;
   determining the current charging parameter based on the determined mapping relationship and the current state of charge of the battery comprises:
   determining the current charging phase from the multiple charging phases based on the current state of charge; and
   determining one of the multiple charging parameters corresponding to the current charging phase to be the current charging parameter.

3. The method of claim 2, wherein the multiple charging phases comprise a first charging phase and a second charging phase, and the charging mode of the first charging phase is different from that of the second charging phase.

4. The method of claim 2, wherein the charging mode of at least one of the multiple charging phases is the pulse charging stage.

5. The method of claim 4, wherein the pulse charging stage comprises at least one of positive pulse charging stage, negative pulse charging stage, and positive-negative pulse charging stage.

6. The method of claim 4, wherein a charging current of the pulse charging stage is a constant current or a variable current.

7. The method of claim 1, wherein before obtaining the current state parameters of the battery, the method further comprises:
communicating with the mobile terminal to determine a charging mode, wherein the charging mode comprises a quick charging mode and a normal charging mode, and a charging speed of the quick charging mode is greater than that of the normal charging mode;
obtaining the current state parameters of the battery from the mobile terminal when the quick charging mode is determined to be used to charge the battery comprises:
communicating with the mobile terminal to determine a charging voltage and a charging current of the quick charging mode;
charging the battery of the mobile terminal according to the current charging parameter when the quick charging mode is determined to be used to charge the battery comprises:
adjusting an output voltage and an output current of the power adapter to be the charging voltage and the charging current of the quick charging mode according to the current charging parameter, so as to charge the mobile terminal in the quick charging mode.

8. A power adapter comprising:
a charging circuit; and
a communication control circuit configured to obtain current state parameters of a battery of the mobile terminal, wherein the current state parameters indicates the current temperature of the battery and the current state of charge of the battery; the communication control circuit is further configured to determine a mapping relationship from one or more of mapping relationships based on the current temperature, the one or more of the mapping relationships correspond to the different temperatures of the battery, each of the one or more of the mapping relationships indicates a mapping relationship between the state of charge of the battery and a charging parameter of the battery under a preset temperature of the battery, the charging parameter comprises at least one of a charging voltage from the power adapter, a charging current from the power adapter and a charging mode of the power adapter, the charging mode comprises at least one of constant voltage charging stage, constant current charging stage, and pulse charging stage; the communication control circuit is further configured to determine the current charging parameter based on the determined mapping relationship and the current state of charge of the battery, and charge the battery of the mobile terminal according to the current charging parameter via the charging circuit.

9. The power adapter of claim 8, wherein a charging process of the battery at the current temperature comprises multiple charging phases, the states of charge of the battery at different charging phases of the multiple charging phases are different, the determined mapping relationship comprises a one-to-one mapping relationship between the multiple charging phases and multiple charging parameters; and
wherein the communication control circuit is configured to determine the current charging phase from the multiple charging phases based on the current state of charge, and determine one of the multiple charging parameters corresponding to the current charging phase to be the current charging parameter.

10. The power adapter of claim 9, wherein the multiple charging phases comprise a first charging phase and a second charging phase, and the charging mode of the first charging phase is different from that of the second charging phase.

11. The power adapter of claim 9, wherein the charging mode of at least one of the multiple charging phases is the pulse charging stage.

12. The power adapter of claim 11, wherein the pulse charging stage comprises at least one of positive pulse charging stage, negative pulse charging stage, and positive-negative pulse charging stage.

13. The power adapter of claim 11, wherein a charging current of the pulse charging stage is a constant current or a variable current.

14. The power adapter of claim 8, wherein the communication control circuit is further configured to communicate with the mobile terminal to determine a charging mode, wherein the charging mode comprises a quick charging mode and a normal charging mode, and a charging speed of the quick charging mode is greater than that of the normal charging mode; the communication control circuit is further configured to communicate with the mobile terminal to determine a charging voltage and a charging current of the quick charging mode when the quick charging mode is determined to be used to charge the battery, and adjust an output voltage and output current of the power adapter to be the charging voltage and the charging current of the quick charging mode according to the current charging parameter, so as to charge the mobile terminal in the quick charging mode.

15. A mobile terminal comprising:
a charging circuit; and
a communication control circuit configured to obtain current state parameters of a battery of the mobile terminal, wherein the current state parameters of the battery indicate the current temperature of the battery and the current state of charge of the battery; the communication control circuit is further configured to determine a mapping relationship from one or more of mapping relationships based on the current temperature of the battery, the one or more of the mapping relationships correspond to the different temperatures of the battery, each of the one or more of the mapping relationships indicates a mapping relationship between the state of charge of the battery and a charging parameter of the battery, the charging parameter comprises at least one of a charging voltage from the power adapter, a charging current from the power adapter, and a charging mode of the power adapter, the charging mode comprises at least one of constant voltage charging stage, constant current charging stage, and pulse charging stage; the communication control circuit is further configured to determine the current charging parameter based on the determined mapping relationship and the current state of charge of the battery, and communicate with the power adapter to transmit the current charging parameter to the power adapter, so as to cause the power adapter to charge the battery according to the current charging parameter via the charging circuit.

16. The mobile terminal of claim 15, wherein a charging process of the battery at the current temperature comprises multiple charging phases, the states of charge of the battery at different charging phases of the multiple charging phases are different, the determined mapping relationship comprises a one-to-one mapping relationship between the multiple charging phases and multiple charging parameters;

the communication control circuit is further configured to determine the current charging phase from the multiple charging phases based on the current state of charge, and determine one of the multiple charging parameters corresponding to the current charging phase to be the current charging parameter.

17. The mobile terminal of claim 16, wherein the multiple charging phases comprise a first charging phase and a second charging phase, and the charging mode of the first charging phase is different from that of the second charging phase.

18. The mobile terminal of claim 16, wherein the charging mode of at least one of the multiple charging phases is the pulse charging stage.

19. The mobile terminal of claim 18, wherein the pulse charging stage comprises at least one of positive pulse charging stage, negative pulse charging stage, and positive-negative pulse charging stage.

20. The mobile terminal of claim 18, wherein a charging current of the pulse charging stage is a constant current or a variable current.

21. The mobile terminal of 15, wherein the communication control circuit is further configured to communicate with the power adapter to determine a charging mode, wherein the charging mode comprises a quick charging mode and a normal charging mode, a charging speed of the quick charging mode is greater than that of the normal charging mode; the communication control circuit is further configured to communicate with the power adapter to determine a charging voltage and a charging current of the quick charging mode when the quick charging mode is determined to be used, and communicate with the power adapter to transmit the current charging parameter to the power adapter, so as to cause the power adapter to adjust an output voltage and an output current of the power adapter to be the charging voltage and the charging current of the quick charging mode upon receiving the current charging parameter from the mobile terminal, and charge the mobile terminal in the quick charging mode.

\* \* \* \* \*